(12) United States Patent
Byrne et al.

(10) Patent No.: US 8,503,169 B2
(45) Date of Patent: Aug. 6, 2013

(54) APPLIANCE CONTROL PANEL

(75) Inventors: Robert M. Byrne, Lima, OH (US); Bret E. Kline, Columbus, OH (US); Steven J. Couvillon, Tipp City, OH (US); Michael Standley, Wapakoneta, OH (US); Rick Hemmelgarn, Tipp City, OH (US)

(73) Assignee: American Trim, L.L.C., Lima, OH (US)

( * ) Notice: Subject to any disclaimer, the term of this patent is extended or adjusted under 35 U.S.C. 154(b) by 320 days.

(21) Appl. No.: 13/051,552

(22) Filed: Mar. 18, 2011

(65) Prior Publication Data
US 2011/0214978 A1 Sep. 8, 2011

Related U.S. Application Data

(63) Continuation-in-part of application No. 12/692,272, filed on Jan. 22, 2010.

(60) Provisional application No. 61/153,337, filed on Feb. 18, 2009.

(51) Int. Cl.
*H05K 5/00* (2006.01)
*H05K 7/00* (2006.01)
*H01H 1/00* (2006.01)
*H01H 1/10* (2006.01)

(52) U.S. Cl.
USPC .......... 361/679.01; 200/502; 200/512

(58) Field of Classification Search
USPC .......... 361/679.01, 679.08, 679.09; 200/502, 200/512, 308
See application file for complete search history.

(56) References Cited

U.S. PATENT DOCUMENTS

| | | | |
|---|---|---|---|
| 3,777,222 A * | 12/1973 | Harris | 341/26 |
| 4,157,539 A | 6/1979 | Hunts et al. | |
| 4,250,495 A * | 2/1981 | Beckerman et al. | 341/33 |
| 4,377,049 A | 3/1983 | Simon et al. | |
| 4,413,252 A | 11/1983 | Tyler et al. | |
| 4,447,692 A | 5/1984 | Mierzwinski | |
| 4,562,315 A | 12/1985 | Aufderheide | |
| 4,975,676 A | 12/1990 | Greenhalgh | |
| 5,239,152 A | 8/1993 | Caldwell et al. | |
| 5,500,497 A | 3/1996 | Merriman | |
| 5,747,757 A | 5/1998 | Van Zeeland et al. | |
| 5,917,165 A | 6/1999 | Platt et al. | |
| 6,137,072 A | 10/2000 | Martter et al. | |
| 6,967,299 B2 * | 11/2005 | Howie et al. | 200/512 |
| 7,221,359 B2 | 5/2007 | Hein et al. | |
| 7,705,257 B2 | 4/2010 | Arione et al. | |
| 7,851,720 B2 | 12/2010 | Raunig | |
| 2007/0181410 A1 | 8/2007 | Baier | |
| 2008/0257706 A1 | 10/2008 | Haag | |
| 2010/0107770 A1 | 5/2010 | Serban et al. | |
| 2010/0155206 A1 | 6/2010 | Arione et al. | |
| 2010/0181181 A1 | 7/2010 | Hamm | |
| 2010/0194521 A1 | 8/2010 | Baier | |

* cited by examiner

*Primary Examiner* — Anthony Haughton
(74) *Attorney, Agent, or Firm* — Rankin, Hill & Clark LLP

(57) ABSTRACT

An appliance control panel is described. The control panel includes a front metal panel, a rearwardly positioned polymeric decorated film and an adhesive layer disposed between the panel and the decorated film. The film overlies an electronic control module which typically includes various displays and press-type switches. Various markings and indicia on the decorated film are visible through openings in the panel and the adhesive layer. The appliance control panel includes one or more capacitance touch switches.

20 Claims, 8 Drawing Sheets

APPLIANCE CONTROL PANEL

CROSS REFERENCES TO RELATED APPLICATIONS

This application claims priority upon U.S. application Ser. No. 12/692,272 filed Jan. 22, 2010 which claims priority upon U.S. provisional application Ser. No. 61/153,337 filed Feb. 18, 2009.

FIELD OF INVENTION

The present invention relates to a control panel for an appliance.

BACKGROUND OF THE INVENTION

A trend in consumer appliances is to utilize user friendly flex type switches and displays in the associated appliance control panel(s) for controlling various operations or settings associated with the appliance. It is generally not possible to use a front metal face panel in the control panel in conjunction with these switches due to undesirable interaction with the metal. Specifically, these disadvantages include poor switch and display functionality. Accordingly, electronic interface style appliance control panels typically utilize a plastic or plastic film front face panel. Although satisfactory in many regards, control panels having plastic faces or plastic film front faces are often considered undesirable for use in high end appliances which typically feature brushed and decorated aluminum or stainless steel outer surfaces. Plastic surfaces generally have limited surface decoration characteristics, and in many instances, are considered by consumers as not particularly aesthetically attractive. Accordingly, it would be desirable to provide an appliance control panel that included a metal front face, and yet which could also incorporate electronic interface features using flex switches and displays incorporated either flush or projecting from the decorated metal surface.

Appliance control panels typically contain a variety of rotary and sliding actuators, push button switches, indicators, and sophisticated circuitry. Traditionally, the actuators, switches, and indicators are mounted on substrates such as printed circuit boards that are enclosed within an apertured enclosure, which as noted is typically plastic. The substrates provide electrical circuits for the various components, i.e. actuators, switches, and indicators. Processing and control functions are typically performed by microprocessors embedded in this printed circuit board. The entire printed circuit board and enclosure assembly is commonly referred to as a "tech box." Once in electrical connection to the appliance and in mechanical connection to the control panel, the tech box receives inputs from the actuators and switches and controls the operation of the appliance. The tech box may also operate or provide information to various indicators in the control panel.

Although satisfactory in many regards, conventional control panels using tech boxes are complex and thus relatively expensive to manufacture. Incorporating a particular tech box in a control panel typically requires unique and/or intricate mounting provisions. These in turn increase manufacturing and assembly costs. Accordingly, it would be desirable to provide a new type of control panel and one that could be economically manufactured. Furthermore, it would be particularly desirable to provide an appliance control panel that could readily and economically receive and accommodate a tech box.

SUMMARY OF THE INVENTION

The difficulties and drawbacks associated with previously known panels and systems are overcome in the present apparatus for an appliance control panel and related method of producing.

In one aspect, the present invention provides a panel assembly having a capacitive touch switch. The assembly comprises a panel defining front and rear faces and at least one aperture. The panel assembly also comprises a decorated transparent polymer film. The film defines front and rear faces and includes a switch indicator region on the rear face. The panel assembly may also comprise an optional adhesive layer between the panel and the film. The optional adhesive layer defines at least one aperture aligned with an aperture defined in the panel. And, the panel assembly also comprises an electronic control module disposed rearward of the rear face of the polymer film. The electronic control module includes a capacitive sensor in electrical field communication with the switch indicator region of the polymer film. Upon contact between a user and the front face of the polymer film, the capacitive sensor undergoes a change in capacitance.

In another aspect, the invention provides a panel assembly having a capacitive touch switch. The assembly comprises a panel defining front and rear faces and at least one aperture. The assembly also comprises a decorated transparent polymer film. The film defines front and rear faces and includes a switch indicator region on the rear face. The assembly may also comprise an optional adhesive layer between the panel and the film. The optional adhesive layer defines at least one aperture aligned with an aperture defined in the panel. And, the assembly also comprises an electronic control module disposed rearward of the rear face of the polymer film. The electronic control module includes a capacitive sensor and a secondary electrode. The secondary electrode is in electrical field communication with the switch indicator region of the polymer film. Upon contact between a user and the front face of the polymer film, the secondary electrode undergoes a change in capacitance.

As will be realized, the invention is capable of other and different embodiments and its several details are capable of modifications in various respects, all without departing from the invention. Accordingly, the drawings and description are to be regarded as illustrative and not restrictive.

DETAILED DESCRIPTION OF THE EMBODIMENTS

Figure 1:
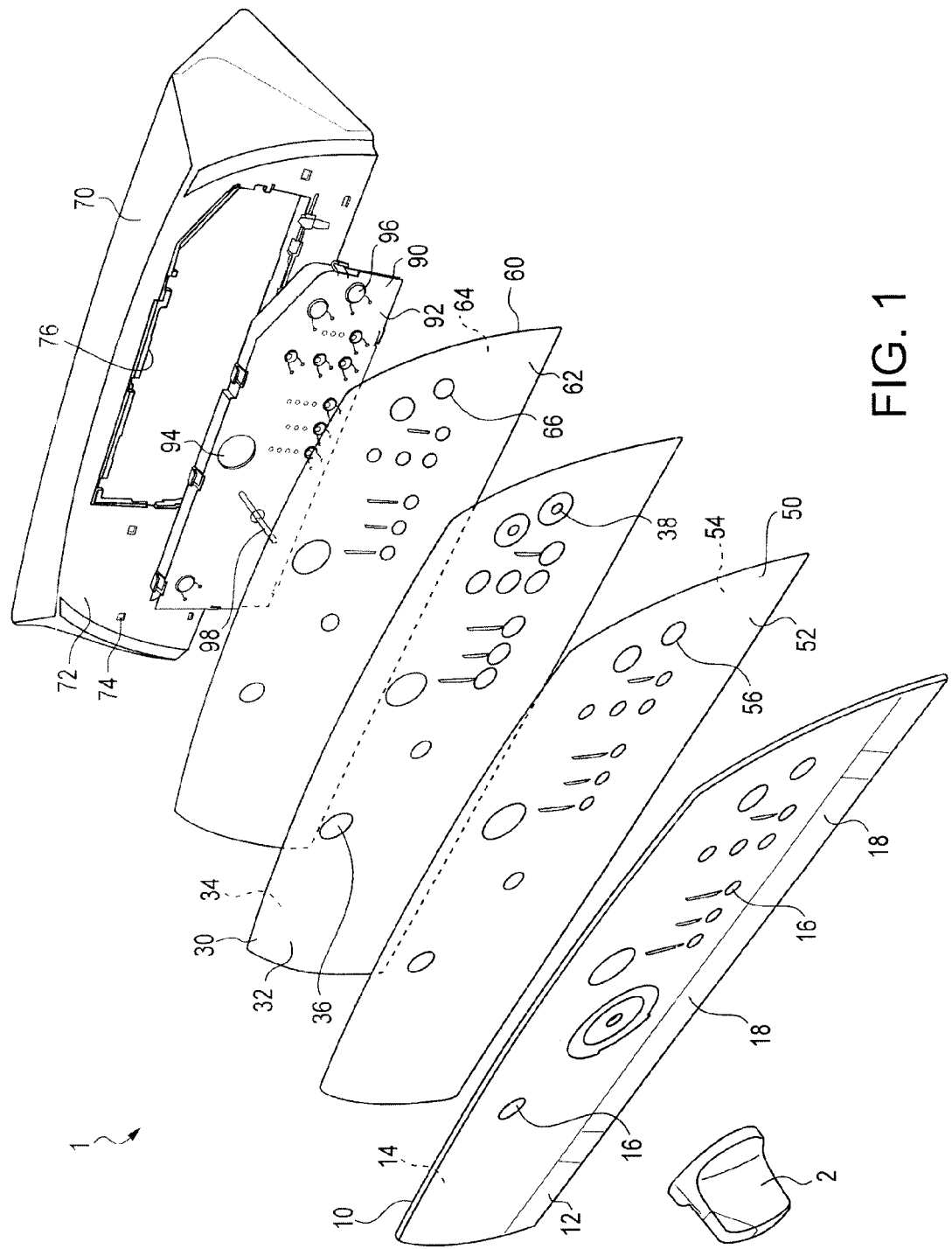
FIG. 1 is an exploded perspective view of a preferred embodiment appliance control panel in accordance with the present invention.

The preferred embodiment appliance control panels in accordance with the present invention comprise a structural support panel which serves as a front face and support member and a rearwardly disposed transparent polymeric film layer. The structural panel is relatively rigid and preferably formed from metal. The control panels further comprise a layer of adhesive preferably disposed between the structural panel and the polymeric film layer. The layer of adhesive is used to adhere the polymeric film layer to a rear face of the structural panel. The structural panel provides structural support for the resulting control panel and the polymeric film adhered thereto preferably by pressure sensitive adhesive bonding technology. The structural panel may be utilized in conjunction with an additional structural member, which as described in certain embodiments, can for example, be in the form of a full molded polymeric backer or console. The resulting assembly provides an aesthetic, thin control panel for an appliance. The control panel preferably features a metal front face which is expected to be more favorably perceived by consumers. The preferred embodiment control panels, their various components and features are all described in greater detail as follows.

Structural Panel

The structural panel is preferably a thin metal panel as typically used in appliance control panels. The panel has a thickness of from about 16 mils to about 35 mils. The panel is typically formed from steel or aluminum, or alloys thereof. Stainless steel is preferred for many applications. The present invention includes the use of plastic for the structural panel, however plastic is less preferred as compared to metal. The faces of the panel are generally finished, and may include one or more decorative and/or protective coatings as known in the art. The front face of the panel also typically contains one or more graphics or other indicia. The structural panel may also define one or more cut-outs or apertures for accessing or viewing actuators and indicators along a rearwardly disposed layer, described in greater detail herein. Although the structural panels are typically flat, the panels may include bent or otherwise curved or raised regions. In certain embodiments, it is preferred to provide a top edge and/or a rear edge that extends rearwardly from the front face of the panel. The edge(s) provide fastening or mounting surfaces for the resulting assembly and impart improved structural rigidity to the panel.

Polymeric Film

The preferred control panels also comprise one or more layer(s) of polymeric film disposed behind or rearwardly of the structural panel. The polymeric film typically has a thickness of from about 5 mils to about 10 mils.

The polymeric film may be formed from a wide variety of materials. However, polyesters such as polyethylene terephthalate (PET) materials, or polycarbonate (PC) materials, or blends of these are often preferred. The present invention also includes the use of blends of polyesters for the polymeric film. PET is generally preferred due to its excellent resistance to fatigue. However, where applications require more aggressive formed shapes, polycarbonate or blends of polycarbonate may be preferred. Polycarbonate is generally less stiff than PET. Thin films of these materials are commercially available from numerous sources. For example, suitable polymer films are available from Tekra Corporation of New Berlin, Wis.; MacDermid of Wantage, United Kingdom under the designation Autotype films; Sabic of Houston, Tex.; and Bayer Corporation of Pittsburgh, Pa.

Generally, these films are supplied having a variety of surface treatments and optionally containing one or more functional finishes. Preferably, and as described in greater detail herein, a frontwardly directed face and/or a rearwardly face of these films is provided with one or more surface decorative layers and a functional finish such as a hardcoat layer as known in the art. Compositions for forming hardcoats are commercially available such as from Tekra Corporation of New Berlin, Wis. It is also contemplated that one or more optional gloss or matte layers can be applied onto select regions of the polymeric film, and preferably along a front face of that film. The rear face of the film receives decoration such as for switches, which can for example include symbols, text, or the like. As previously noted, it is contemplated that the rearwardly directed face of the film may also be appropriately surface treated.

In certain embodiments described herein, the polymeric film can include one or more ribs or raised regions on either or both of its front face or rear face. Preferably, the ribs are provided on both faces of the film. The ribs provide an inexpensive spacer function in the event that application requirements demand such. For example, in the event that dimensions of a tech box necessitate that the front face of the control panel be spaced outwardly therefrom, incorporating ribs in the assembly can provide a cost effective solution for front face spacing. The ribs can also serve to impart additional structural rigidity to the polymer film and to a panel assembly utilizing such film. The ribs may be in nearly any configuration however, it is generally preferred that the ribs be relatively straight, have a width of about 0.5 inch, and a thickness of from about 2 mils to about 10 mils. When expressed relative to the thickness of a non-ribbed region of the polymeric film, the thickness of the ribbed region is from about 200% to about 20% of the thickness of the non-ribbed region. The total thickness of a ribbed region is from about 7 mils to about 20 mils. The proportion of surface area for a face of the polymer film occupied by ribs is typically from about 10% to about 90%, with 40% to 60% being preferred.

The polymeric film is transparent, or at least substantially transparent. This feature enables one or more decorative layers deposited along the rear of the film to be viewable through a front face of the film. As described in greater detail herein, in the assembled control panels, the decorative layers on the rear face of the polymeric layer can be seen through apertures formed in the structural panel and apertures formed in the adhesive layer, both of which preferably overlie the front face of the polymeric film layer. The term "transparent" as used herein refers to the film used at the thicknesses described herein being sufficiently clear or see-through so that the indicia, markings, or graphics deposited on a rear face of the film are visible and legible from the front face of the film.

Adhesive Layer

The preferred control panels also comprise one or more layers or regions of an adhesive layer between the structural panel and the polymeric film. Preferably, the adhesive layer is selectively disposed between a rear face of the structural panel and a forward face of the polymeric film. An adhesive layer may also be used between the polymeric film layer and a front face of a console, as described in greater detail herein. Preferably, the adhesive is a pressure sensitive adhesive (PSA) layer. Such pressure sensitive adhesives are commercially available, such as from 3M of St. Paul, Minn. under the designation 7555T. Typically, the adhesive layer has a thickness of from about 0.5 mils to about 1.5 mils.

When using a pressure sensitive layer, the adhesive is typically applied onto either the rear face of the structural panel or the front face of the polymeric film. Preferably, the adhesive is applied onto the front face of the polymeric film. A release layer is then applied over the exposed face of the adhesive. Release layers are well known in the art and available from numerous commercial sources. Preferably, the adhesive layer extends over from about 80% to about 90% of the polymeric film. However, the present invention includes layers having greater or lesser degrees of coverage.

It is also contemplated that the pressure sensitive adhesive layer could also be applied as a die cut adhesive layer. Bulk rolls of die cut adhesives are available from a variety of commercial suppliers such as 3M under the designation 486MP and are die cut to exact patterns by third party web converters.

For embodiments utilizing ribbed polymer films, it is preferred that the adhesive be applied to only the areas occupied by the ribs or raised surface regions. Thus, it is preferred that the non-rib areas on a face of the polymer film be free of adhesive. This configuration is preferred since less adhesive is required thereby resulting in material cost savings.

Electronic Control Modules

The present invention control panel assembly may further include one or more electronic control modules. These devices are referred to herein as "tech boxes." Generally, these are devices utilizing electronic circuitry and other means to control and/or operate the device such as an appliance. The electronic control modules or tech boxes typically include one or more visual displays for outputting information to a user. The tech boxes also typically include one or more press-type switches that provide digital inputs or signals to the tech box and associated controls. And, the tech boxes may further include various actuators such as rotary actuators to provide other signals and inputs to the device or appliance of interest.

A wide array of electronic control modules are commercially available. Typically, modules can be custom designed for specific applications. It will be appreciated that the present invention is not directed to the design or actual operation of the modules, but rather to their incorporation into the various control panels described herein.

Consoles

The preferred embodiment control panels also include a rearwardly disposed console for housing the electronic control module and for attachment of the structural panel and polymeric film. It will be appreciated that a console may provide additional support for the resulting control panel. The consoles typically define a front face and a receiving region with mounting provisions for receiving and affixing an electronic control module. The console can be configured to receive and/or mount the electronic control module from a front face of the console, or from a rear face of the console. The consoles may be formed or provided in a wide range of sizes, shapes, and configurations. And, the consoles can be formed from an assortment of materials such as metals, plastics, and combinations thereof.

It is preferred that the console be formed from a collection of individual or separate components, which can be attached or otherwise secured to one another. Preferably, the console includes a pair of end components or end caps and an intermediate portion that upon assembly, engages the end caps and extends between the end caps. The intermediate portion preferably includes provisions for receiving the electronic control module. This configuration enables different intermediate portions to be used with the same pair of end caps. For example, a console having a relatively long length can be provided by using an intermediate portion having a desired length in conjunction with a common pair of end caps. And, a console having a shorter length can be provided by using a shorter intermediate portion with the same pair of end caps. This practice leads to reduced manufacturing complexity and inventory demands.

Methods

The various control panels as described herein are generally formed by obtaining a polymeric film material and printing one or more layers or regions of decorative images, colors, or indicia on a rear face of the film. Finally, any front surface decorations or glosses are deposited on a front face of the film and the front surface adhesive layers are printed. All adhesive layers are preferably covered with release liners for downstream processing. The decorated regions are preferably formed in only the areas of the polymeric film that will be viewable through apertures defined in the structural panel. An apertured, decorated structural panel is then mated to the decorated polymeric film by the adhesive.

More specifically, the preferred embodiment appliance control panels are preferably formed as follows. Currently known techniques are used to form the structural panel. Generally, for a metal panel, these techniques may involve cutting or stamping the metal panel having a desired size and/or configuration along with forming any apertures, raised or depressed regions, or other shapes. The metal panel can be formed from large sheets or rolls of stock metal. The panel faces may be subjected to one or more finishing operations, and receive one or more decorative layers or functional coatings. The metal panel can receive one or more decorative images or coatings by a variety of different techniques such as, but not limited to, screen printing, pad printing, digital printing, brushing, resist techniques and the like.

The polymeric film is preferably purchased in bulk having the desired surface treatments and/or functional finishes, such as a hardcoat along its forward face. A wide array of solid, i.e. opaque, and transparent finishes may be applied onto the rear face of the polymeric film to obtain desired decorative and light transmission properties.

All decorative layers, colors, images, indicia, symbols, text or other visual markings are preferably deposited such as by printing, along the rear face of the polymeric film layer. Decorative inks are available from a number of commercial suppliers such as for example Sun Chemical of Parsippany, N.J.; Nazdar of Shawnee, Kans.; Proell, Inc. of St. Charles, Ill.; Coates Inks now available from Sun Chemical; and DeCo-Chem of Mishawaka, Ind. It will be appreciated that the polymeric film layer is preferably transparent or at least substantially so, to thereby enable the decorative layers or images to be viewable along the front face of the polymeric film. A variety of printing techniques can be used, however screen printing is preferred.

As previously noted, the front face of the polymeric film preferably receives a selectively applied layer of a pressure sensitive adhesive. The resulting exposed face of the adhesive is then covered with a release layer.

The polymeric film layer is then joined to the metal panel. In the event that a release liner has been applied to the adhesive, that liner is then removed. The polymeric film and metal panel are appropriately aligned with one another and the exposed face of the adhesive is contacted with the rear face of the metal panel. A sealing force is applied to the resulting assembly whereby the control panel is formed.

In some applications, it may still be preferable to mount a decorated metal electronic control interface directly to a molded plastic structure. In this case, an additional layer of selective pressure sensitive adhesive and associated release layer may be applied as the final rear surface printing layer.

The front face of the metal panel can receive graphics, indicia, and/or other markings by printing with any of the inks or similar compositions as described herein. It is also contemplated that the metal panel can receive one or more layers of a decorated transparent film along its front face.

Preferred Control Panels

FIG. 1 illustrates a preferred embodiment control panel assembly 1 in accordance with the present invention. The assembly 1 comprises a metal panel 10 defining a front face 12 and an oppositely directed rear face 14. One or more raised or recessed region(s) may be formed in the panel 10 as desired. The panel 10 typically defines one or more slotted and/or circular apertures 16. It will be appreciated that the metal panel 10 can include a wide variety of aperture styles, shapes, and sizes and is in no way limited to the particular apertures 16 depicted in FIG. 1. As previously explained, the metal panel 10 preferably includes one more graphic layer(s) 18 or other text, indicia, coloring or the like along the front face 12 of the panel 10.

The panel assembly 1 also comprises an adhesive layer 50. The adhesive is preferably a pressure sensitive adhesive. The adhesive layer 50 is preferably in the same general size, shape, and configuration as that of the metal panel 10. The adhesive layer 50 defines a front face 52, an oppositely directed rear face 54, and apertures such as slotted apertures and/or circular apertures 56 shown in FIG. 1. It is preferred that the apertures 56 defined in the adhesive layer 50 are arranged and sized so as to match and be aligned with apertures 16 defined in the metal panel 10. Thus, any slotted apertures 56 in the adhesive layer 50 should correspond to and be aligned with the slotted apertures 16 defined in the metal panel 10. And, any circular apertures 56 in the adhesive layer 50 should correspond to and be aligned with the circular apertures 16 defined in the metal panel 10.

The preferred embodiment control panel assembly 1 also comprises a decorated polymeric film layer 30. The decorated polymeric layer 30 preferably has the same general size, shape, and configuration as that of the metal panel 10 but for the noted apertures. However, for certain components mounted on the polymeric film, apertures 36 may be provided extending through the film 30. The decorated polymeric film 30 defines a front face 32 and an oppositely directed rear face 34. Various decorations such as images, colors, and/or symbols are applied to the rear face 34 of the film to form the decorated film layer 30. For example, graphics 38 may be deposited for a switch or other component. As previously explained, these decorative regions will be visible along the front face 32 of the film 30. The layer 50 of a pressure sensitive adhesive can be deposited on the front face 32 of the polymeric film layer 30 prior to assembly with the metal panel 10.

The preferred embodiment control panel assembly 1 also comprises a second adhesive layer 60 for attaching the polymeric film layer 30 and the metal panel 10 to a console 70, described in greater detail herein. The second adhesive layer 60 defines a front face 62, an oppositely directed rear face 64, and one or more apertures 66 extending through the adhesive layer 60. The second adhesive layer 60 is preferably formed from the same material(s) as the adhesive layer 50. The second adhesive layer 60 is disposed between the rear face 34 of the polymeric film 30 and a front face 72 of the console 70. The adhesive layer 60 generally has the same shape, size, and configuration as the polymer film 30, the adhesive layer 50, and the structural panel 10.

The preferred embodiment control panel assembly 1 may further comprise a console 70 or other housing or enclosure, as illustrated in FIG. 1. The console 70 generally defines the previously noted front face 72, one or more optional apertures 74, and a tech box receiving region 76 that is sized, shaped, and configured to receive and accommodate a tech box, such as described herein. The console can be formed from a wide array of materials, however metal and/or plastic are preferred. Moreover, the console 70 can be configured for subsequent attachment to an appliance or can be formed integral with the appliance.

The preferred embodiment control panel assembly 1 may further comprise a tech box 90 as known in the art. Generally, the tech box defines a front face 92, one or more displays 94, one or more switches 96 such as press switches as known in the art, and one or more actuators 98. For actuators having forwardly extending components or shafts, such as actuator 98 depicted in FIG. 1, it will be appreciated that corresponding apertures or other openings will be appropriately provided in the metal panel 10, polymeric layer 30, and adhesive layers 50 and 60. In this embodiment, the tech box 90 is affixed along frontwardly directed regions of the console front face 72.

The preferred embodiment control panel assembly 1 may also comprise one or more knobs 2 or other actuator or gripping elements.

It will be appreciated that in no way is the present invention limited to the particular control panel assembly illustrated in FIG. 1. Instead, the invention includes a wide array of different combinations of layers, components, and panels.

Figure 2:
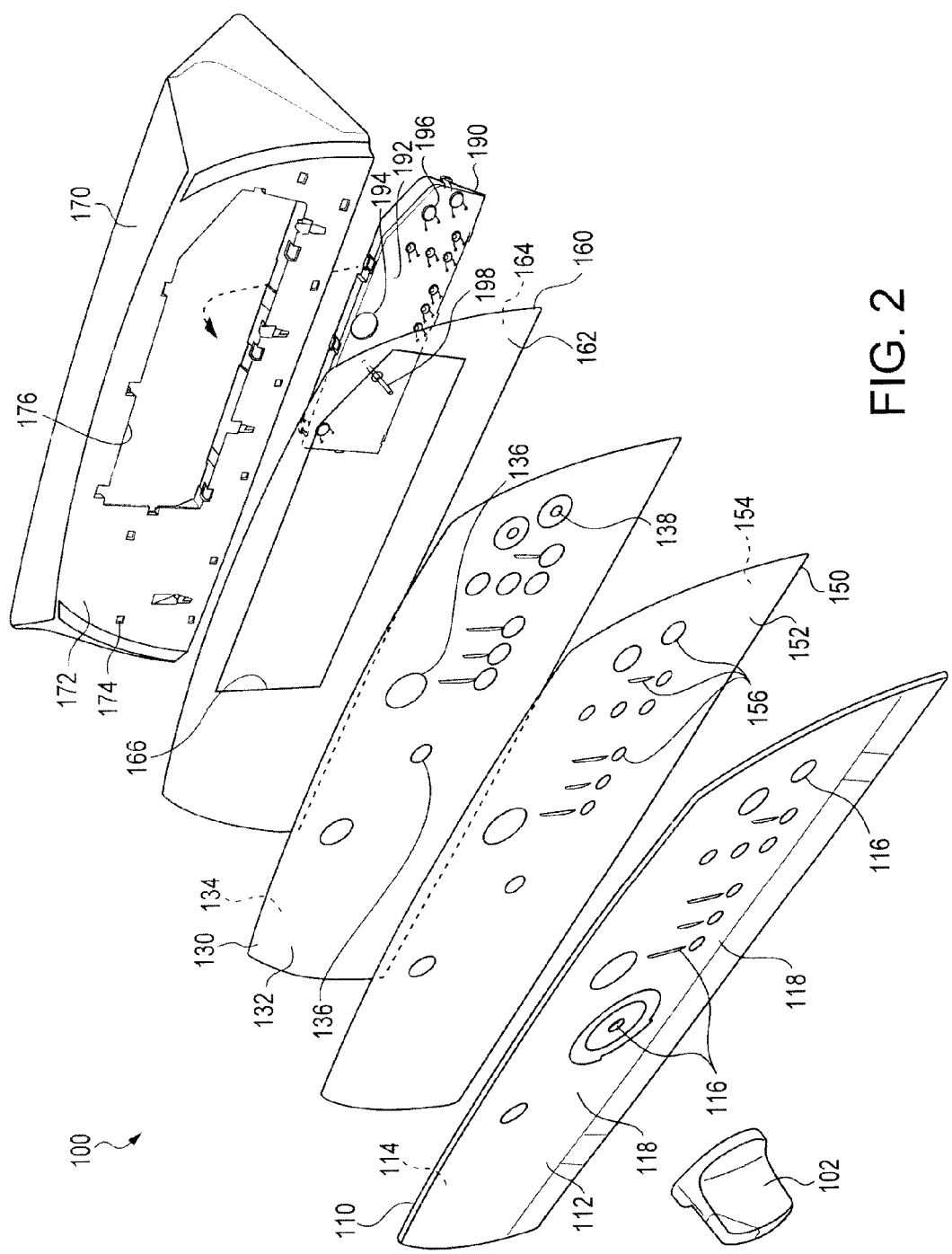
FIG. 2 is an exploded perspective view of another preferred embodiment appliance control panel in accordance with the present invention.

FIG. 2 illustrates another preferred embodiment control panel assembly 100 in accordance with the present invention. The assembly 100 comprises a metal panel 110 defining a front face 112 and an oppositely directed rear face 114. One or more raised or recessed region(s) may be formed in the panel 100 as desired. The panel 100 typically defines one or more slotted apertures 116, and one or more circular apertures 116. It will be appreciated that the metal panel 110 can include a wide variety of aperture styles, shapes, and sizes and is in no way limited to the particular apertures 116 depicted in FIG. 2. As previously explained the metal panel 100 preferably includes one more graphic layer(s) 118 along the front face 112 of the panel 100.

The panel assembly 100 also comprises an adhesive layer 150. The adhesive is preferably a pressure sensitive adhesive. The adhesive layer 150 is preferably in the same general size, shape, and configuration as that of the metal panel 110. The adhesive layer 150 defines a front face 152, an oppositely directed rear face 154, and apertures such as slotted apertures 156 and circular apertures 156 shown in FIG. 2. It is preferred that the apertures 156 defined in the adhesive layer 150 be arranged and sized so as to match and be aligned with apertures 116 defined in the metal panel 110. Thus, the slotted apertures 156 in the adhesive layer 150 should correspond to and be aligned with the slotted apertures 116 defined in the metal panel 110. And, the circular apertures 156 in the layer 150 should correspond to and be aligned with the circular apertures 116 defined in the metal panel 110.

The preferred embodiment control panel assembly 100 also comprises a decorated polymeric film layer 130. The decorated polymeric layer 130 preferably has the same general size, shape, and configuration as that of the metal panel 110 but for the noted apertures. However, for certain components mounted on the polymeric film, apertures 136 may be provided extending through the polymeric film layer 130. The polymeric film layer 130 defines a front face 132 and an oppositely directed rear face 134. Various decorations such as images, colors, and/or symbols are applied to the rear face 134 of the film to form the decorated film layer 130. For example, graphics 138 may denote a switch. As previously explained, these decorative regions will be visible along the front face 132 of the film 130.

The preferred embodiment control panel assembly 100 also comprises a second adhesive layer 160 for attaching the polymeric film layer 130 and the metal panel 110 to a console 170, described in greater detail herein. The second adhesive layer 160 defines a front face 162, an oppositely directed rear face 164, and a single, relatively large aperture or cut-out region 166 extending through the adhesive layer 160. But for the large aperture 166, the adhesive layer 160 generally has the same shape and size as the polymer film 130, the adhesive layer 150, and the structural panel 110. The second adhesive layer 160 is preferably formed from the same material(s) as the adhesive layer 150. The second adhesive layer 160 is disposed between the rear face 134 of the polymeric film and a front face 172 of the console 170.

The preferred embodiment control panel assembly 100 may further comprise a console 170 or other housing or enclosure, as illustrated in FIG. 2. The console 170 generally defines the previously noted front face 172, one or more optional apertures 174, and a tech box receiving region 176 that is sized, shaped, and configured to receive and accommodate a tech box, such as described herein. The console 170 can be formed from a wide array of materials, however metal and/or plastic are preferred. Moreover, the console 170 can be configured for subsequent attachment to an appliance or can be formed integral with the appliance.

The preferred embodiment control panel assembly 100 may further comprise a tech box 190 as known in the art. Generally, the tech box defines a front face 192, one or more displays 194, one or more switches 196 such as press switches as known in the art, and one or more actuators 198. For actuators having forwardly extending components or shafts, such as actuator 198 depicted in FIG. 2, it will be appreciated that corresponding apertures or other openings will be appropriately provided in the metal panel 110, polymeric layer 130, and adhesive layers 150 and 160. In this embodiment, the tech box 190 is affixed to the console 170 from the rear of the console. 170

The preferred embodiment control panel assembly 100 may also comprise one or more knobs 102 or other actuator or gripping elements.

It will be appreciated that in no way is the present invention limited to the particular control panel assembly illustrated in FIG. 2. Instead, the invention includes a wide array of different combinations of layers, components, and panels.

Figure 3:
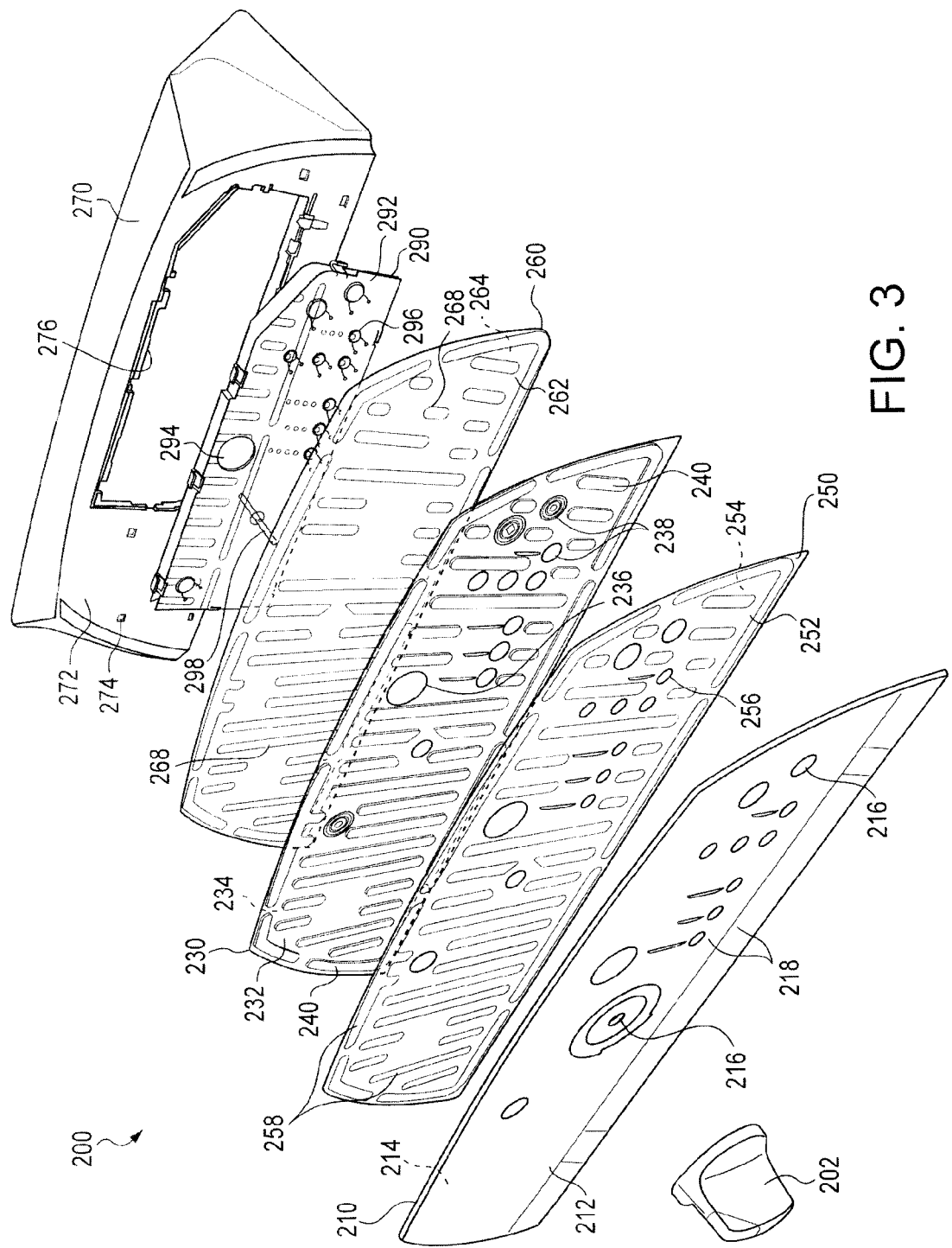
FIG. 3 is an exploded perspective view of another preferred embodiment appliance control panel in accordance with the present invention.

FIG. 3 illustrates another preferred embodiment control panel assembly 200 in accordance with the present invention. The assembly 200 comprises a metal panel 210 defining a front face 212 and an oppositely directed rear face 214. One or more raised or recessed region(s) may be formed in the panel 210 as desired. The panel 210 typically defines one or more slotted and/or circular apertures 216. It will be appreciated that the metal panel 210 can include a wide variety of aperture styles, shapes, and sizes and is in no way limited to the particular apertures depicted in FIG. 3. As previously explained, the metal panel 210 preferably includes one more graphic layer(s) 218 or other text, indicia, coloring or the like along the front face 212 of the panel 210.

The preferred embodiment control panel assembly 200 also comprises a decorated polymeric film layer 230. The polymeric layer 230 is characterized by including a plurality of outwardly projecting ribs or raised surface regions, illustrated in FIG. 3 as regions 240. These ribs 240 may serve to impart greater strength and rigidity to the film 230 and the resulting panel assembly 200. The ribs 240 may also serve to provide spacing between the polymeric film 230 and either or both of the metal panel 210 and a console 270, described in greater detail herein. The decorated polymeric layer 230 preferably has the same general size, shape, and configuration as that of the metal panel 210 but for the noted apertures. The decorated polymeric film 230 defines a front face 232 and an oppositely directed rear face 234. One or more apertures 236 are also defined in the film as generally described herein. The ribs 240 may be formed on either or both of the front face 232 or rear face 234 of the polymer films 230. Preferably, the ribs 240 are provided on both the front and rear faces 232 and 234 of the film 230. Various decorations such as images, colors, and/or symbols are applied to the rear face 234 of the film to form the decorated film layer 230. Examples include a graphic 238 for a switch. As previously explained, these decorative regions will be visible along the front face 232 of the film 230.

The panel assembly 200 also comprises an adhesive layer 250. The adhesive is preferably a pressure sensitive adhesive. The adhesive layer 250 is preferably in the same general shape and configuration as the collection of ribs 240 on the front face 232 of the polymer film 230. The adhesive layer defines a front face 252, an oppositely directed rear face 254 as shown in FIG. 3. It will be appreciated that the adhesive preferably occupies only areas 258 corresponding to that of the ribs on the polymeric film layer 230. Accordingly, it will be understood that preferably, certain areas of the adhesive do not overlie areas of apertures defined in the structural panel 210 and the polymer layer 230. These areas within the adhesive layer yet which are free of adhesive, are for purposes of convenience, referred to herein as apertures 256. It is preferred that the apertures 256 defined in the adhesive layer 250 are arranged and sized so as to match and be aligned with apertures 216 defined in the metal panel 210. Thus, the slotted apertures in the adhesive layer 250 should correspond to and be aligned with the slotted apertures defined in the metal panel 210. And, any circular apertures in the adhesive layer 250 should correspond to and be aligned with the circular apertures defined in the metal panel 210. Preferably, the adhesive material constituting the adhesive layer 250 extends in only the areas 258 which overlie the ribs 240 or raised surface regions defined along a front face 232 of the polymeric film 230. This strategy results in material cost savings since upon assembly and contact with the metal panel 210, generally, only the ribs 240 of the front face 232 of the film 230 contact the rear face 214 of the metal panel 210 through the adhesive areas 258.

The preferred embodiment control panel assembly 200 also comprises a second adhesive layer 260 for attaching the polymeric film layer 230 and the metal panel 210 to a console 270, described in greater detail herein. The second adhesive layer 260 defines a front face 262, and an oppositely directed rear face 264. The second adhesive layer is preferably formed from the same material(s) as the adhesive layer 250. The second adhesive layer 260 is disposed between the rear face 234 of the polymeric film and a front face 272 of the console 270. In the event that the rear face 234 of the polymeric film 230 includes one or more rearwardly projecting ribs 240, then the second adhesive layer 260 preferably includes adhesive material in only the corresponding regions 268 to the location of the rearwardly directed ribs 240. As previously explained, the adhesive layer 260 and/or its associated release layer defines adhesive-free regions as appropriate to accommodate components in a tech box, described in greater detail herein.

The preferred embodiment control panel assembly 200 may further comprise a console 270 or other housing or enclosure, as illustrated in FIG. 3. The console 270 generally defines the previously noted front face 272, one or more optional apertures 274, and a tech box receiving region 276 that is sized, shaped, and configured to receive and accommodate a tech box, such as described herein. The console can be formed from a wide array of materials, however metal and plastic are preferred. Moreover, the console 270 can be configured for subsequent attachment to an appliance or can be formed integral with the appliance.

The preferred embodiment control panel assembly 200 may further comprise a tech box 290 as known in the art. Generally, the tech box defines a front face 292, one or more displays 294, one or more switches 296 such as press switches as known in the art, and one or more actuators 298. For actuators having forwardly extending components or shafts, such as actuator 298 depicted in FIG. 3, it will be appreciated that corresponding apertures or other openings will be appropriately provided in the metal panel 210, polymeric layer 230, and adhesive layers 250 and 260. For this embodiment, the tech box 290 is engaged to a forwardly directed face of the console 270.

The preferred embodiment control panel assembly 200 may also comprise one or more knobs 202 or other actuator or gripping elements.

It will be appreciated that in no way is the present invention limited to the particular control panel assembly illustrated in FIG. 3. Instead, the invention includes a wide array of different combinations of layers, components, and panels.

Figure 4:
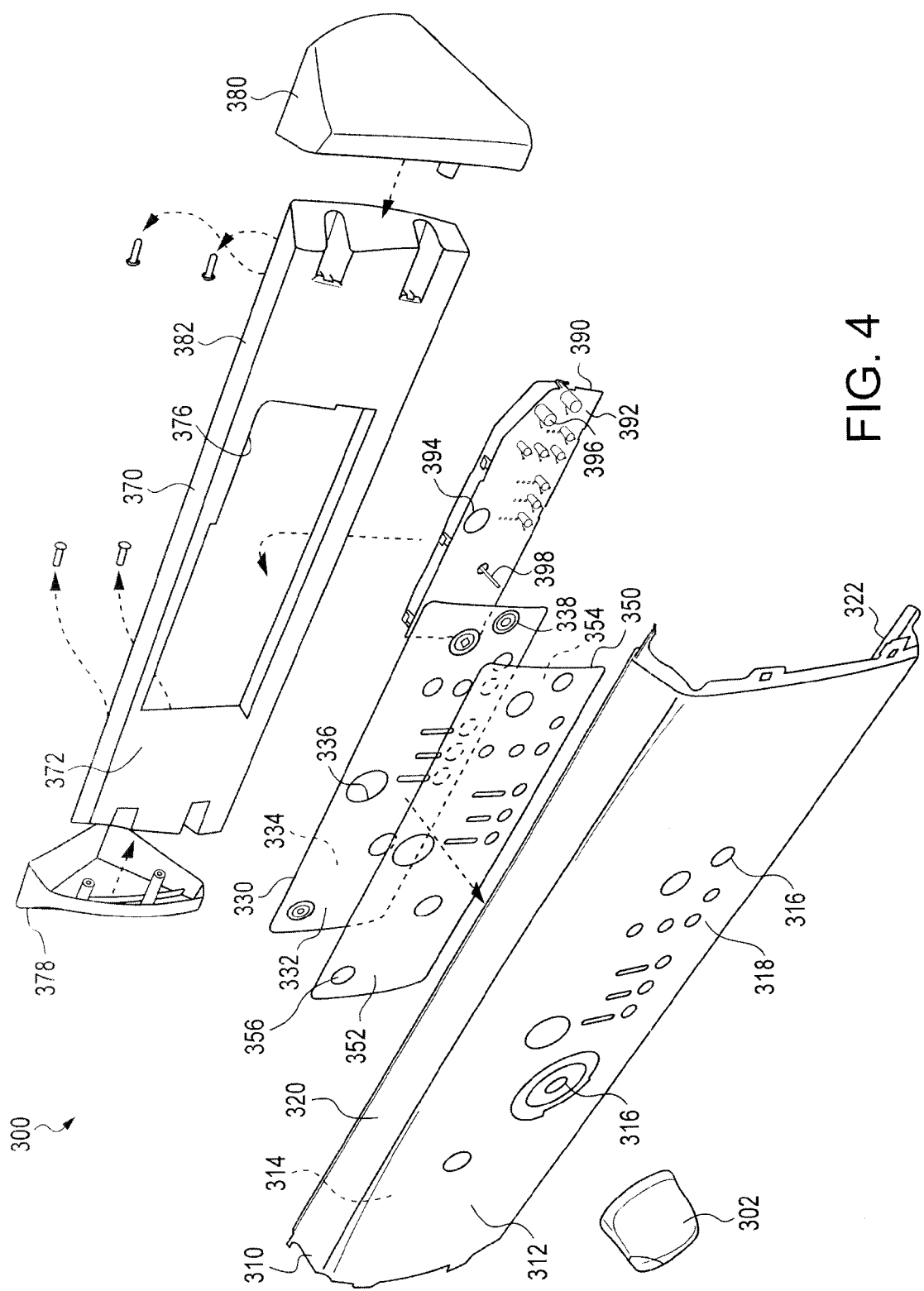
FIG. 4 is an exploded perspective view of another preferred embodiment appliance control panel in accordance with the present invention.

FIG. 4 illustrates another preferred embodiment control panel assembly 300 in accordance with the present invention. The assembly 300 comprises a metal panel 310 defining a front face 312 and an oppositely directed rear face 314. One or more raised or recessed region(s) may be formed in the panel 310 as desired. The panel 310 typically defines one or more slotted apertures and/or one or more circular apertures 316. It will be appreciated that the metal panel 310 can include a wide variety of aperture styles, shapes, and sizes and is in no way limited to the particular apertures depicted in FIG. 4. As previously explained, the metal panel 310 preferably includes one more graphic layer(s) 318 along the front face 312 of the panel 310. In this version of the invention, the metal panel 310 includes a top edge 320 and a corresponding bottom edge 322. These edges extend rearwardly from the front face 312 of the panel 310. The edges can be in nearly any configuration or shape.

The panel assembly 300 also comprises an adhesive layer 350. The adhesive is preferably a pressure sensitive adhesive. In this version of the invention, the adhesive layer 350 is reduced in size and preferably in the same general size, shape, and configuration as that of a polymeric film layer 330 also reduced in size, as described herein. The adhesive layer 350 defines a front face 352, an oppositely directed rear face 354, and apertures 356 such as slotted apertures and circular apertures as shown in FIG. 4. It is preferred that the apertures defined in the adhesive layer 350 be arranged and sized so as to match and be aligned with apertures 316 defines in the metal panel 310. Thus, the slotted apertures in the adhesive layer 350 should correspond to and be aligned with the slotted apertures defined in the metal panel 310. And, the circular apertures in the adhesive layer 350 should correspond to and be aligned with the circular apertures defined in the metal panel 310.

The preferred embodiment control panel assembly 300 also comprises a decorated polymeric film layer 330. The decorated polymeric layer 330 preferably has the same general size, shape, and configuration as a front face of a corresponding tech box 390 described in greater detail herein. The polymeric film layer 330 defines a front face 332 and an oppositely directed rear face 334. The film layer 330 also includes one or more apertures 336. Various decorations such as images, colors, and/or symbols are applied to the rear face 334 of the film to form the decorated film layer 330. For example, graphics 338 may be deposited for identifying a press switch. As previously explained, these decorative regions will be visible along the front face 332 of the film 330. In this version of the invention, the overall size of the adhesive layer 350 and the polymeric layer 330 is reduced, thereby resulting in material cost savings. The size of these layers need only be large enough to cover a front face of a tech box 390 described in greater detail herein.

The preferred embodiment control panel assembly 300 may further comprise a console 370 or other housing or enclosure, as illustrated in FIG. 4. The console 370 generally defines the previously noted front face 372, and a tech box receiving region 376 that is sized, shaped, and configured to receive and accommodate a tech box, such as described herein. In this version of the invention, the tech box 390 mounts to the rear of the console 370. The console 370 can be formed from a wide array of materials, however metal and plastic are preferred. Moreover, the console 370 can be configured for subsequent attachment to an appliance or can be formed integral with the appliance. In this embodiment, the console 370 includes a pair of end caps 378 and 380, and an intermediate portion 382 extending between and engaged with the end caps The preferred embodiment control panel assembly 300 may further comprise a tech box 390 as known in the art. Generally, the tech box defines a front face 392, one or more displays 394, one or more switches 396 such as press switches as known in the art, and one or more actuators 398. For actuators having forwardly extending components or shafts, such as actuator 398 depicted in FIG. 4, it will be appreciated that corresponding apertures or other openings will be appropriately provided in the metal panel 310, polymeric layer 330, and the adhesive layer 350.

The preferred embodiment control panel assembly 300 may also comprise one or more knobs 302 or other actuator or gripping elements.

It will be appreciated that in no way is the present invention limited to the particular control panel assembly illustrated in FIG. 4. Instead, the invention includes a wide array of different combinations of layers, components, and panels.

Figure 5:
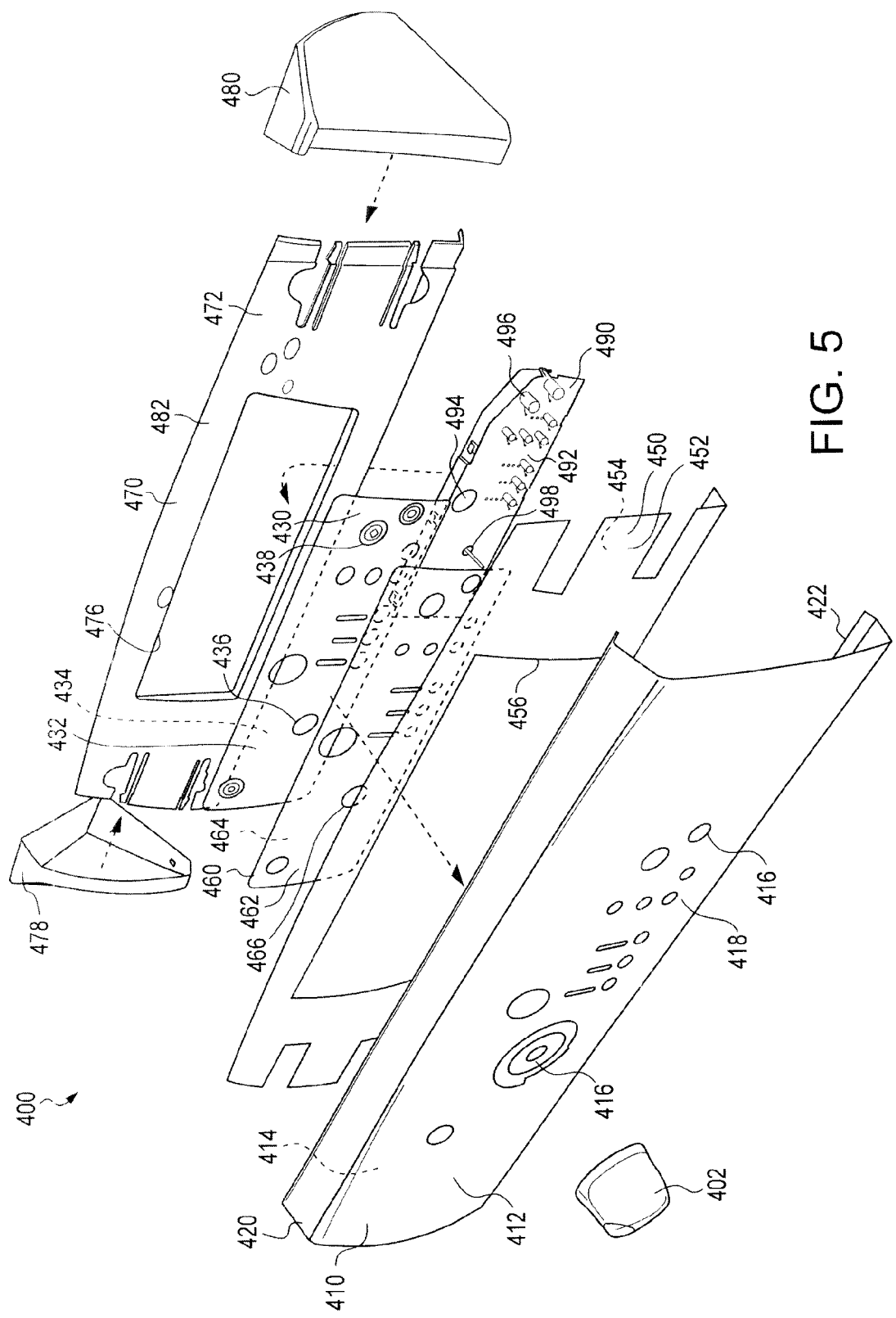
FIG. 5 is an exploded perspective view of another preferred embodiment appliance control panel in accordance with the present invention.

FIG. 5 illustrates another preferred embodiment control panel assembly 400 in accordance with the present invention. The assembly 400 comprises a metal panel 410 defining a front face 412 and an oppositely directed rear face 414. One or more raised or recessed region(s) may be formed in the panel 410 as desired. The panel 410 typically defines one or more slotted apertures and one or more circular apertures 416. It will be appreciated that the metal panel 410 can include a wide variety of aperture styles, shapes, and sizes and is in no way limited to the particular apertures depicted in FIG. 5. As previously explained, the metal panel 410 preferably includes one more graphic layer(s) 418 or other text, indicia, coloring or the like along the front face 412 of the panel 410. The panel 410 also preferably includes rearwardly extending top and bottom edges 420 and 422, respectively.

The panel assembly 400 also comprises a multiple component adhesive layer including a primary adhesive layer portion 450 and a secondary adhesive layer portion 460. Upon assembly of the control panel 400, the two portions 450 and 460 are preferably coplanar with one another. The adhesive is preferably a pressure sensitive adhesive. The primary adhesive layer 450 is preferably in the same general size and shape as that of the metal panel 410. The primary adhesive layer portion 450 defines a front face 452, an oppositely directed rear face 454, and a primary aperture 456 shown in FIG. 5. It is preferred that the primary aperture 456 defined in the primary adhesive layer portion 450 is arranged and sized so as to match and be aligned with a polymeric film layer 430 and a corresponding tech box 490, both of which are described in greater detail herein. The secondary adhesive layer portion 460 is sized and shaped to fit within the primary aperture 456 of the primary adhesive layer portion 460. The secondary adhesive layer portion 460 defines a front face 462, an oppositely directed rear face 464, and one or more apertures 466 extending through the layer portion 460.

The preferred embodiment control panel assembly 400 also comprises a decorated polymeric film layer 430. The decorated polymeric layer 430 preferably has the same general size, shape, and configuration as that of the secondary adhesive layer portion 460 and a front face of a tech box 490 described in greater detail herein. The decorated polymeric film 430 defines a front face 432, an oppositely directed rear face 434, and one or more apertures 436. Various decorations such as images, colors, and/or symbols are applied to the rear face 434 of the film to form the decorated film layer 430. For example, a graphic 438 can be applied for identifying a press switch. As previously explained, these decorative regions will be visible along the front face 432 of the film 430. The secondary adhesive layer portion 460 can be deposited on the front face 432 of the polymeric film layer 430 prior to assembly with the metal panel 410.

The preferred embodiment control panel assembly 400 may further comprise a console 470 or other housing or enclosure, as illustrated in FIG. 5. The console 470 generally defines a front face 472, and a tech box receiving region 476 that is sized, shaped, and configured to receive and accommodate a tech box 490, such as described herein. In this embodiment, the console 470 includes a pair of end caps 478 and 480, and an intermediate portion 482 extending between and engaged with the end caps. The console 470 can be formed from a wide array of materials, however metal and plastic are preferred. Moreover, the console 470 can be configured for subsequent attachment to an appliance or can be formed integral with the appliance.

The preferred embodiment control panel assembly 400 may further comprise a tech box 490 as known in the art. Generally, the tech box 490 defines a front face 492, one or more displays 494, one or more switches 496 such as press switches as known in the art, and one or more actuators 498. For actuators having forwardly extending components or shafts, such as actuator 498 depicted in FIG. 5, it will be appreciated that corresponding apertures or other openings will be appropriately provided in the metal panel 410, polymeric layer 430, and adhesive layers 450 and 460. In this version of the invention, the tech box 490 mounts along a rearwardly directed region of the console 470.

The preferred embodiment control panel assembly 400 may also comprise one or more knobs 402 or other actuator or gripping elements.

It will be appreciated that in no way is the present invention limited to the particular control panel assembly illustrated in FIG. 5. Instead, the invention includes a wide array of different combinations of layers, components, and panels.

Figure 6:
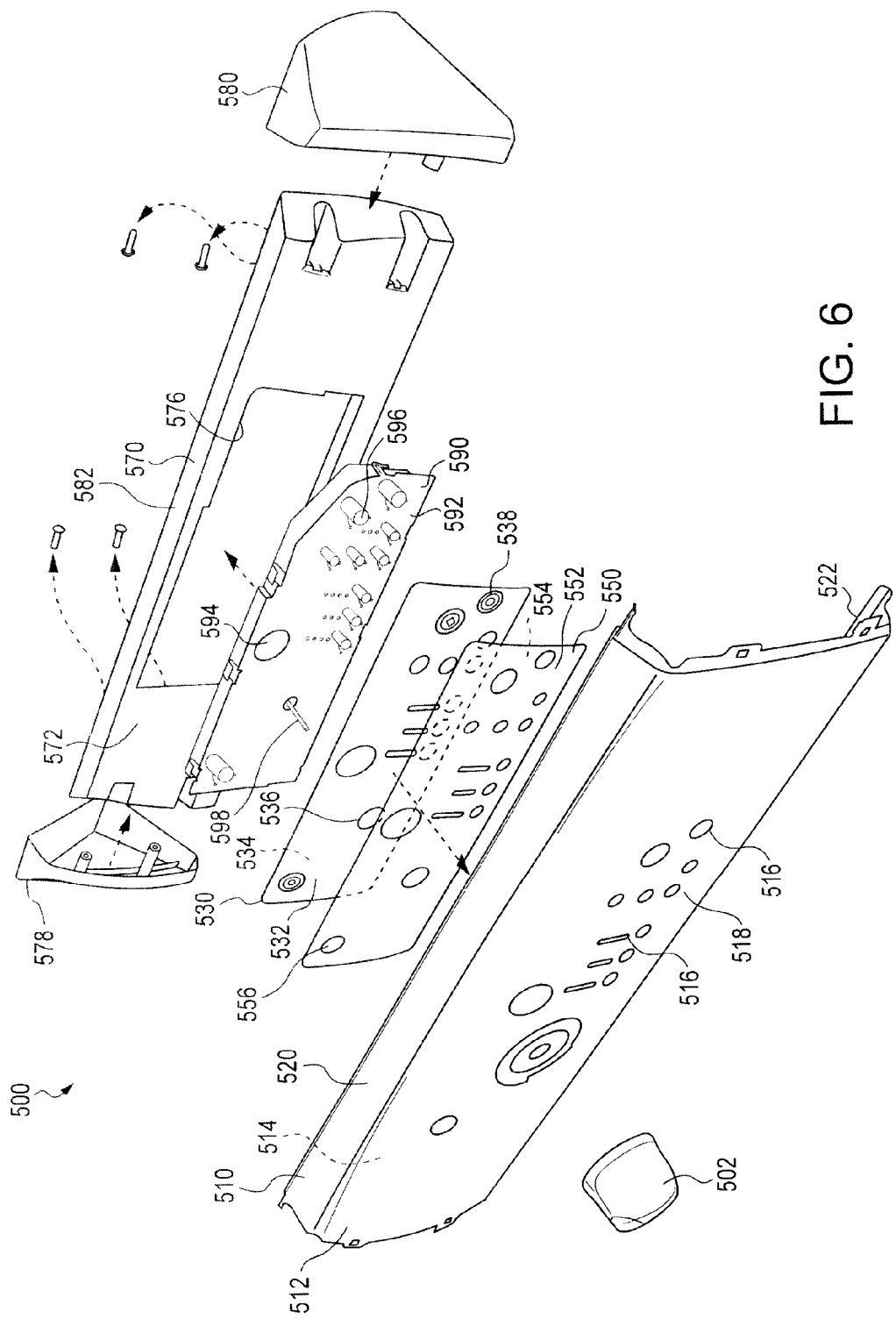
FIG. 6 is an exploded perspective view of another preferred embodiment appliance control panel in accordance with the present invention.

FIG. 6 illustrates another preferred embodiment control panel assembly 500 in accordance with the present invention. The assembly 500 comprises a metal panel 510 defining a front face 512 and an oppositely directed rear face 514. One or more raised or recessed region(s) may be formed in the panel 510 as desired. The panel 510 typically defines one or more slotted apertures 516, and one or more circular apertures 516. It will be appreciated that the metal panel 510 can include a wide variety of aperture styles, shapes, and sizes and is in no way limited to the particular apertures depicted in FIG. 6. As previously explained the metal panel 510 preferably includes one more graphic layer(s) 518 along the front face 512 of the panel 510. Top and bottom edges 520 and 522 extend rearwardly from the panel 510.

The panel assembly 500 also comprises an adhesive layer 550. The adhesive is preferably a pressure sensitive adhesive. The adhesive layer 550 is preferably of a reduced size and in the same general size, shape, and configuration as that of a polymeric film layer 530 and a tech box 590 described herein. The adhesive layer defines a front face 552, an oppositely directed rear face 554, and apertures 556 such as one or more slotted apertures and circular apertures shown in FIG. 6. It is preferred that the apertures 556 defined in the adhesive layer 550 be arranged and sized so as to match and be aligned with apertures defines in the metal panel 510. Thus, the slotted aperture should correspond to and be aligned with the slotted aperture defined in the metal panel 510. And, the circular apertures should correspond to and be aligned with the circular apertures defined in the metal panel 510.

The preferred embodiment control panel assembly 500 also comprises a decorated polymeric film layer 530. The decorated polymeric layer 530 is also a reduced size and preferably has the same general size, shape, and configuration as that of the tech box 590. The polymeric film layer 530 defines a front face 532 and an oppositely directed rear face 534. One or more apertures 536 may also be defined in the polymeric film layer 530. Various decorations such as images, colors, and/or symbols are applied to the rear face 534 of the film to form the decorated film layer 530. For example, a graphic 538 can be applied to denote a pressure switch. As previously explained, these decorative regions will be visible along the front face 532 of the film 530.

The preferred embodiment control panel assembly 500 may further comprise a console 570 or other housing or enclosure, as illustrated in FIG. 6. The console 570 generally defines a front face 572, and a tech box receiving region 576 that is sized, shaped, and configured to receive and accommodate a tech box, such as described herein. In this version of the invention, the console 570 includes a pair of end caps 578 and 580 and an intermediate portion 582 extending between and engaged with the end caps 578, 580. The console 570 can be formed from a wide array of materials, however metal and plastic are preferred. Moreover, the console 570 can be configured for subsequent attachment to an appliance or can be formed integral with the appliance.

The preferred embodiment control panel assembly 500 may further comprise a tech box 590 as known in the art. Generally, the tech box defines a front face 592, one or more displays 594, one or more switches 596 such as press switches as known in the art, and one or more actuators 598. For actuators having forwardly extending components or shafts, such as actuator 598 depicted in FIG. 6, it will be appreciated that corresponding apertures or other openings will be appropriately provided in the metal panel 510, polymeric layer 530, and the adhesive layers 550.

The preferred embodiment control panel assembly 500 may also comprise one or more knobs 502 or other actuator or gripping elements.

It will be appreciated that in no way is the present invention limited to the particular control panel assembly illustrated in FIG. 6. Instead, the invention includes a wide array of different combinations of layers, components, and panels.

As previously noted, the various control panel assemblies may utilize one or more capacitive touch sensitive switches. A capacitive or "touch switch" uses a capacitive sensor, or an electrode and a capacitive sensor in which the electrode is in electrical communication with the sensor. That is, one or more electrical conductors are provided between the electrode and the sensor. A change in capacitance of the sensor or the electrode occurs for example upon contact between an exposed region of polymeric film in the control panel assembly and a user's finger for instance. Generally, the preferred embodiment control panels in accordance with the invention include one or more passive polymeric films and one or more capacitive touch switches or components thereof disposed behind the film(s). The film(s) preferably comprises one or more polymers and is generally electrically nonconductive. Upon a user touching a front face of the film, the rearwardly disposed capacitive switch assembly or component(s) undergoes a change in capacitance. The change in capacitance is detected preferably by electronics in the panel assembly. Depending upon the extent of such change, the switch and/or other electronics actuates or otherwise controls one or more components of the control panel and/or the appliance of interest.

The polymeric film(s) disposed between the capacitive touch switch and a user, although generally electrically nonconductive (or generally electrically insulating), can be further characterized by describing those films in terms of their dielectric constant. A dielectric is an electrical insulator that can be polarized by an applied electric field. When a dielectric is placed in an electric field, electric charges do not flow through the material, as in a conductor, but only slightly shift from their average equilibrium positions causing dielectric polarization. Because of dielectric polarization, positive charges are displaced toward the field and negative charges shift in the opposite direction. This creates an internal electric field which reduces the overall field within the dielectric itself. Although the term "insulator" implies low electrical conduction, "dielectric" is typically used to describe materials with a high polarizability. The latter term is expressed by a number called the dielectric constant. Generally, the term "dielectric constant" is a number relating the ability of a material to carry alternating current to the ability of vacuum to carry alternating current.

The materials for use as the polymeric films disposed in front of the capacitive switch (or its sensing electrode), typically have a dielectric constant (k) of from about 1.1 to about 10.0, more preferably from about 1.5 to about 7.5, more preferably from about 1.75 to about 5.0, more preferably from about 2.0 to about 4.5, more preferably from about 2.2 to about 4.0, and most preferably from about 2.3 to about 3.5

Although the invention includes numerous strategies for incorporating a capacitive touch sensitive switch in a control panel, a preferred approach is as follows. A printed circuit board (PCB) based capacitive switch element may be used. Discreet, solid state elements for the capacitive switch are mounted to a printed circuit board, which is incorporated in a control panel. The capacitive switch elements preferably have a compliant feature such as for example, a compressible biasing member provided by spring or foam components, that controls or limits movement between the backside of the polymeric film relative to the capacitive sensor, within a particular dimensional or tolerance range. A consequence of this configuration is that the switch region on the polymeric film can not be directly backlit since the light emitting element, e.g. LED, would interfere with the sensor.

Figure 7:
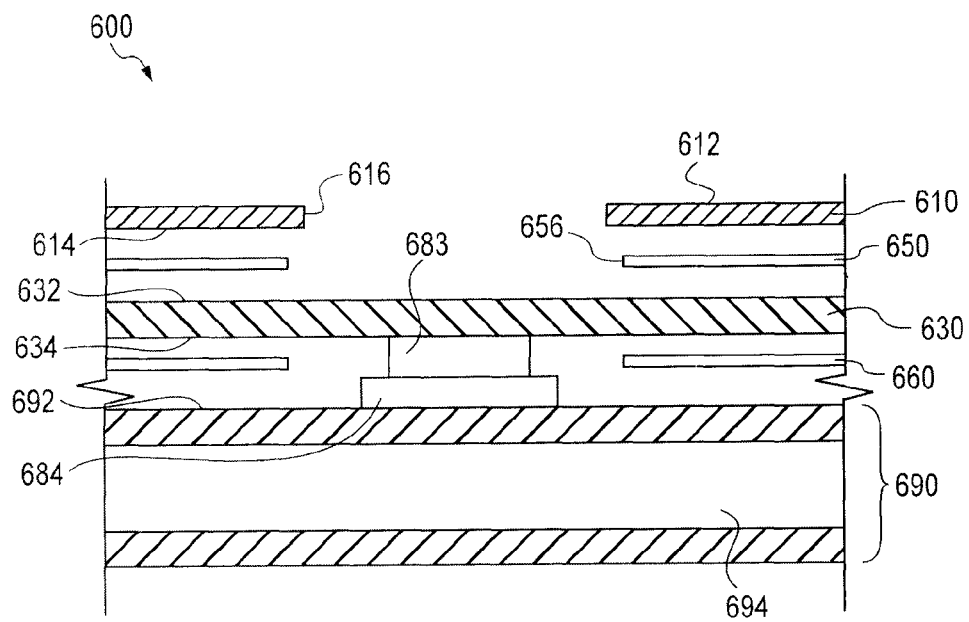
FIG. 7 is a schematic cross sectional view of another preferred embodiment appliance control panel in accordance with the present invention.

FIG. 7 illustrates a representative cross sectional view of a preferred embodiment control panel assembly in accordance with the invention. This exploded assembly illustration generally corresponds to the control panel assembly depicted in FIG. 1. However, it will be appreciated that the invention includes alternate embodiments such as all of the control panel assemblies of FIGS. 2-6 utilizing one or more capacitive touch switches. FIG. 7 illustrates a preferred embodiment control panel assembly 600 comprising a metal panel 610 defining a front face 612, an oppositely directed rear face 614, and one or more apertures 616. The panel assembly 600 also comprises an optional adhesive layer 650 generally disposed along the rear face 614 of the metal panel 610. The adhesive layer 650 defines an aperture 656 generally aligned with the aperture 616 of the metal panel 610. The control panel assembly 600 also comprises a decorative polymeric layer 630 defining a front face 632 and an oppositely directed rear face 634. The panel assembly 600 also comprises an optional adhesive layer 660 along the rear face of the polymeric layer 630. And the panel assembly 600 comprises an electronic control module also known as a "tech box" 690 defining a front face 692 and an interior 694 for enclosing various electronic components.

The preferred embodiment control panel assembly 600 includes a capacitive touch switch that generally includes a capacitive sensing electrode 684. Preferably, the sensing electrode 684 is disposed directly on the front face 692 of the tech box 690. A biasing member 683 is preferably disposed between the rear face 634 of the polymeric layer 630 and the sensing electrode 684. As noted, the biasing member 683 is preferably compressible and may be in the form of a spring or an elastically deformable foam member. It will be appreciated that FIG. 7 is a schematic, exploded view and upon final assembly of the control panel assembly 600, the sensing electrode 684 is in contact and electrical communication with one or more printed circuit boards or other electronic controllers in the tech box 690.

In operation, the capacitive touch switch operates as follows. A user, wishing to actuate or otherwise change an operational status of an appliance by operation of the switch merely touches the front face 632 of the polymeric layer 630 using his or her finger or thumb. It will be appreciated that contact occurs between the user and the polymeric layer 630 through the aperture 616 in the metal panel 610. As a result of contact between the user and the polymeric layer 630, a change in capacitance of the sensor 684 occurs and is detected and corresponding circuitry or components preferably provided in association with the tech box 690 initiate the desired actuation or change in operational state of the appliance. The change in capacitance occurs because the sensor is in electrical field communication with a switch indicator region (which the user contacts) of the polymeric layer.

Figure 8:
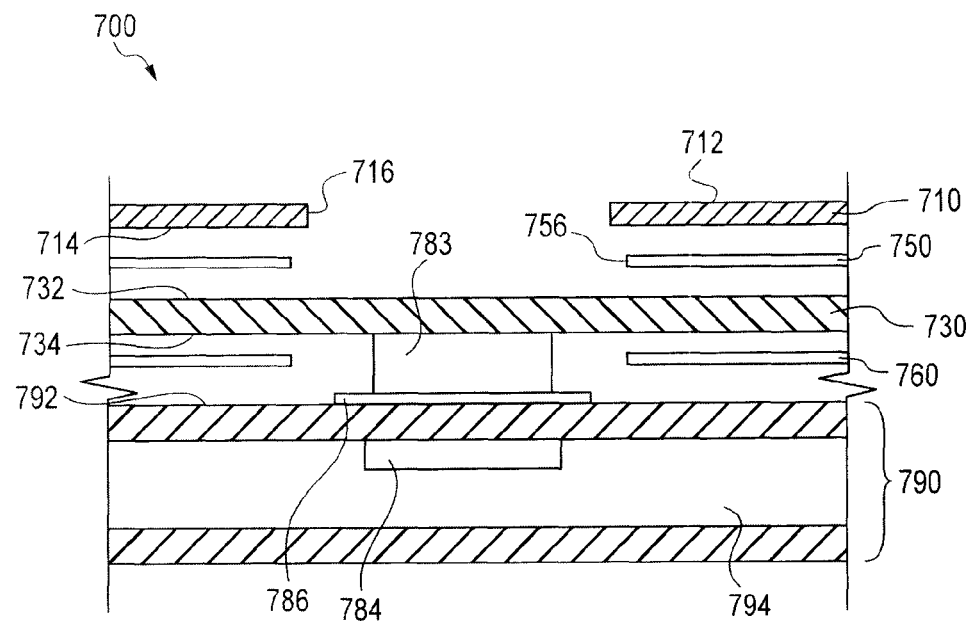
FIG. 8 is a schematic cross sectional view of another preferred embodiment appliance control panel in accordance with the present invention.

FIG. 8 illustrates an alternative configuration for the capacitive touch switch. A preferred embodiment control panel assembly 700 is shown comprising a metal panel 710 defining a front face 712, an oppositely directed rear face 714, and one or more apertures 716. The panel assembly 700 also comprises an optional adhesive layer 750 generally disposed along the rear face 714 of the metal panel 710. The adhesive layer 750 defines an aperture 756 generally aligned with the aperture 716 of the metal panel 710. The control panel assembly 700 also comprises a decorative polymeric layer 730 defining a front face 732 and an oppositely directed rear face 734. The panel assembly 700 also comprises an optional adhesive layer 760 along the rear face of the polymeric layer 730. And the panel assembly 700 comprises a "tech box" 790 defining a front face 792 and an interior 794 for enclosing various electronic components.

The preferred embodiment control panel assembly 700 includes a capacitive touch switch that generally includes a capacitive sensing electrode 784. Preferably, the sensing electrode 784 is disposed within the interior 794 of the tech box 790. The touch switch in this embodiment also includes a secondary electrode 786. That electrode is in electrical communication with the sensing electrode 784 disposed in the interior of the tech box 790. A biasing member 783 is preferably disposed between the rear face 734 of the polymeric layer 730 and the secondary electrode 786. As noted, the biasing member 783 is preferably compressible and may be in the form of a spring or an elastically deformable foam member. It will be appreciated that FIG. 8 is a schematic exploded view and upon final assembly of the control panel assembly 700, the secondary electrode 786 and/or the sensing electrode 784 are in contact and electrical communication with one or more printed circuit boards or other electronic controllers in the tech box 790.

In operation, the capacitive touch switch depicted in FIG. 8 operates as follows. A user, wishing to actuate or otherwise change an operational status of an appliance by operation of the switch merely touches the front face 732 of the polymeric layer 730 using his or her finger or thumb. It will be appreciated that contact occurs between the user and the polymeric layer 730 through the aperture 716 in the metal panel 710. As a result of contact between the user and the polymeric layer 730, a change in capacitance of the secondary electrode 786 occurs. The change in capacitance occurs because the secondary electrode is in electrical field communication with a switch indicator region (which the user contacts) of the polymeric layer. Preferably, the tech box includes provisions for detecting the change in capacitance of (i) the secondary electrode 786 and/or (ii) the sensing electrode 784. It will be understood that any capacitance changes of the secondary electrode will be reflected by the capacitive sensor since those components are in electrical communication with one another.

Figure 9:
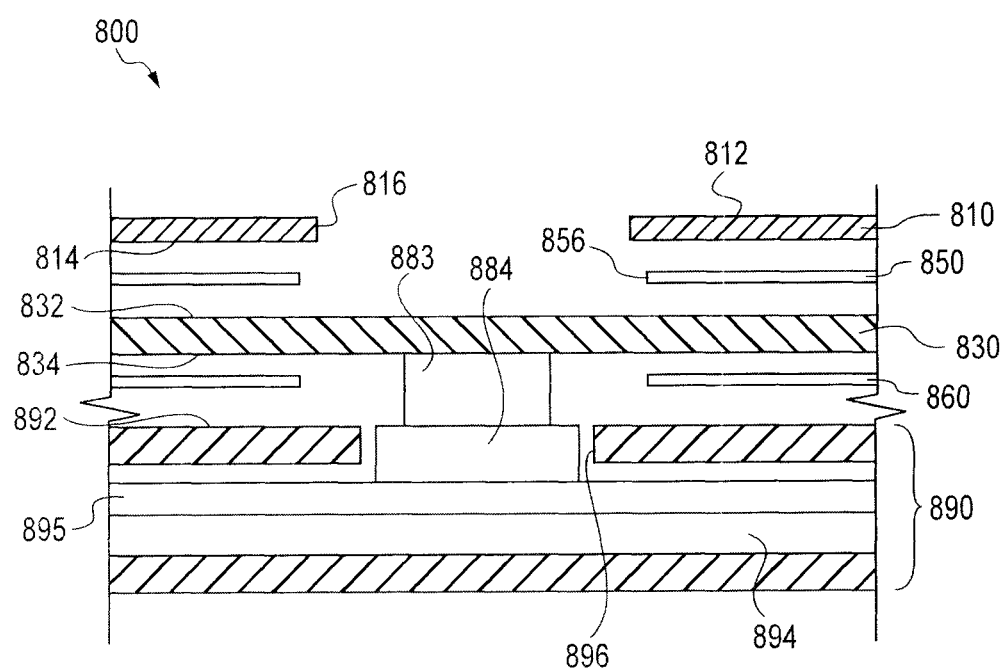
FIG. 9 is a schematic cross sectional view of another preferred embodiment appliance control panel in accordance with the present invention.

FIG. 9 illustrates an alternative configuration for the capacitive touch switch. A preferred embodiment control panel assembly 800 is illustrated comprising a metal panel 810 defining a front face 812, an oppositely directed rear face 814, and one or more apertures 816. The panel assembly 800 also comprises an optional adhesive layer 850 generally disposed along the rear face 814 of the metal panel 810. The adhesive layer 850 defines an aperture 856 generally aligned with the aperture 816 of the metal panel 810. The control panel assembly 800 also comprises a decorative polymeric layer 830 defining a front face 832 and an oppositely directed rear face 834. The panel assembly 800 also comprises an optional adhesive layer 860 along the rear face 834 of the polymeric layer 830. And, the panel assembly 800 comprises a "tech box" 890 defining a front face 892 and an interior 894 for enclosing various electronic components such as a circuit board 895.

The preferred embodiment control panel 800 includes a capacitive touch switch that generally includes a capacitive sensing electrode 884. Preferably, the tech box 890 defines an aperture 896 sized and shaped to accommodate the sensing electrode 884 to extend therethrough. A biasing member 883 is preferably disposed between the rear face 834 of the polymeric layer 830 and the sensing electrode 884. The biasing member 883 is preferably compressible and may be in the form of a spring or an elastically deformable foam member.

The operation of the capacitive touch switch is generally as previously described in conjunction with the control panel 600 depicted in FIG. 7.

In all of the embodiments using one or more capacitive touch switches, it will be appreciated that the invention includes a wide array of arrangements and configurations for the switch assembly and associated components such as the capacitive sensing electrode, the biasing member, and any optional secondary electrodes. For example, the capacitive sensing electrode could be mounted along the rear of the tech box, or along the front or rear of another component in the control panel assemblies. In addition, it is contemplated that the capacitive sensing electrode could be located elsewhere and not necessarily in or associated with the tech box. For such remote mounting configurations, it is contemplated that a secondary electrode could be used along a polymeric film which provides electrical communication to a capacitive sensing electrode at another or remote location.

Details as to capacitive switches, switching circuits using such switches, operation and construction of such switches are provide in one or more of the following U.S. Pat. Nos. 4,377,049; 4,413,252; 4,157,539; 4,975,676; 4,447,692; 5,917,165; 7,851,720; 7,705,257; 7,221,359; and 4,562,315. In addition, similar details as to capacitive switches are provided in one or more of U.S. Patent Application Publications 2010/0181181; 2008/0257706; and 2010/0107770.

All patents, published applications, articles and the like referenced herein are hereby incorporated by reference.

It will be understood that the control panels of the present invention are incorporated into an appliance, and preferably such that the rear face of the polymeric film layer is appropriately enclosed or otherwise covered.

The present invention control panel can be used in conjunction with a variety of appliances and other consumer household devices. Non-limiting examples of such appliances include refrigerators, freezers, clothes washers, clothes dryers, ranges, stoves, thermal ovens, cook tops, microwave ovens, dishwashers, water heaters, trash compactors and air conditioners. It will be appreciated that in no way is the present invention control panel limited to appliances or other household devices. Instead, it is contemplated that the present invention will have significant utility in an array of other applications, systems, and devices.

Many other benefits will no doubt become apparent from future application and development of this technology.

It will be understood that any one or more feature or component of one embodiment described herein can be combined with one or more other features or components of another embodiment. Thus, the present invention includes any and all combinations of components or features of the embodiments described herein.

As described hereinabove, the present invention solves many problems associated with previous type devices. However, it will be appreciated that various changes in the details, materials and arrangements of parts, which have been herein described and illustrated in order to explain the nature of the invention, may be made by those skilled in the art without departing from the principle and scope of the invention.

What is claimed:

1. A panel assembly having a capacitive touch switch, the assembly comprising:
   a panel defining front and rear faces and at least one aperture;
   a decorated transparent polymer film, the film defining front and rear faces and including a switch indicator region on the rear face;
   an optional adhesive layer between the panel and the film, the adhesive layer defining at least one aperture aligned with an aperture defined in the panel; and
   an electronic control module disposed rearward of the rear face of the polymer film and including a capacitive sensor in electrical field communication with the switch indicator region of the polymer film, wherein upon contact between a user and the front face of the polymer film, the capacitive sensor undergoes a change in capacitance.

2. The panel assembly of claim 1 wherein the capacitive sensor is disposed along the front face of the electronic control module.

3. The panel assembly of claim 1 wherein the electronic control module defines a front enclosure wall defining an aperture and the capacitive sensor is disposed in the aperture.

4. The panel assembly of claim 1 wherein the polymer film has a dielectric constant of from about 1.1 to about 10.

5. The panel assembly of claim 1 further comprising a biasing member disposed between the rear face of the polymer film and the capacitive sensor.

6. The panel assembly of claim 5 wherein the biasing member is a spring.

7. The panel assembly of claim 5 wherein the biasing member is a foam material.

8. The panel assembly of claim 1 wherein the panel is formed from metal.

9. The panel assembly of claim 8 wherein the metal is selected from the group consisting of aluminum, steel, and alloys thereof.

10. The panel assembly of claim 1 wherein the panel includes indicia on the front face of the panel.

11. The panel assembly of claim 1 wherein the electronic control module includes provisions for detecting the change in capacitance of the capacitive sensor.

12. A panel assembly having a capacitive touch switch, the assembly comprising:
    a panel defining front and rear faces and at least one aperture;
    a decorated transparent polymer film, the film defining front and rear faces and including a switch indicator region on the rear face;
    an optional adhesive layer between the panel and the film, the adhesive layer defining at least one aperture aligned with an aperture defined in the panel; and
    an electronic control module disposed rearward of the rear face of the polymer film and including a capacitive sensor and a secondary electrode, the secondary electrode being in electrical field communication with the switch indicator region of the polymer film, wherein upon contact between a user and the front face of the polymer film, the secondary electrode undergoes a change in capacitance.

13. The panel assembly of claim 12 wherein the capacitive sensor is disposed within an interior region of the electronic control module.

14. The panel assembly of claim 12 wherein the secondary electrode is disposed along the front face of the electronic control module.

15. The panel assembly of claim 12 wherein the polymer film has a dielectric constant of from about 1.1 to about 10.

16. The panel assembly of claim 12 further comprising a biasing member disposed between the rear face of the polymer film and the secondary electrode.

17. The panel assembly of claim 16 wherein the biasing member is a spring.

18. The panel assembly of claim 16 wherein the biasing member is a foam material.

19. The panel assembly of claim 12 wherein the electronic control module includes provisions for detecting the change in capacitance of at least one of (i) the secondary electrode and (ii) the capacitive sensor.

20. The panel assembly of claim 12 wherein the capacitive sensor is in electrical communication with the secondary electrode.

* * * * *